United States Patent
Braganca et al.

(10) Patent No.: US 8,462,461 B2
(45) Date of Patent: Jun. 11, 2013

(54) SPIN-TORQUE OSCILLATOR (STO) WITH MAGNETICALLY DAMPED FREE LAYER

(75) Inventors: Patrick Mesquita Braganca, San Jose, CA (US); Bruce Alvin Gurney, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 36 days.

(21) Appl. No.: 13/176,378

(22) Filed: Jul. 5, 2011

(65) Prior Publication Data

US 2013/0009712 A1    Jan. 10, 2013

(51) Int. Cl.
G11B 5/127    (2006.01)
G11B 5/187    (2006.01)

(52) U.S. Cl.
USPC .................................. 360/125.3; 360/324.2

(58) Field of Classification Search
USPC ............... 360/125.3, 324.2, 125.71; 331/94.1
See application file for complete search history.

(56) References Cited

U.S. PATENT DOCUMENTS

| | | | |
|---|---|---|---|
| 5,695,864 A | 12/1997 | Slonczewski | |
| 6,130,814 A * | 10/2000 | Sun | 361/143 |
| 6,542,341 B1 | 4/2003 | Carey et al. | |
| 6,943,997 B2 * | 9/2005 | Gill | 360/324.12 |
| 7,130,166 B2 * | 10/2006 | Gill | 360/324.12 |
| 7,245,462 B2 * | 7/2007 | Huai et al. | 360/324.11 |
| 7,307,818 B1 * | 12/2007 | Park et al. | 360/324.1 |
| 7,459,993 B2 * | 12/2008 | Sunwoo et al. | 333/134 |
| 7,486,486 B2 * | 2/2009 | Nakamura et al. | 360/324 |
| 7,577,021 B2 | 8/2009 | Guo et al. | |
| 7,633,699 B2 * | 12/2009 | Kaka et al. | 360/67 |
| 7,667,933 B2 | 2/2010 | Kudo et al. | |
| 7,678,475 B2 | 3/2010 | Slavin et al. | |
| 7,826,160 B2 | 11/2010 | Sato et al. | |
| 7,864,569 B2 * | 1/2011 | Ho | 365/171 |
| 7,982,996 B2 * | 7/2011 | Smith et al. | 360/59 |
| 8,064,244 B2 * | 11/2011 | Zhang et al. | 365/158 |
| 8,184,411 B2 * | 5/2012 | Zhang et al. | 360/324.2 |
| 8,203,389 B1 * | 6/2012 | Zhou et al. | 331/3 |
| 8,233,247 B2 * | 7/2012 | Carey et al. | 360/324 |
| 8,305,716 B2 * | 11/2012 | Fukuzawa et al. | 360/324.2 |
| 2005/0023938 A1 * | 2/2005 | Sato et al. | 310/363 |

(Continued)

OTHER PUBLICATIONS

Zhu, et al., "Microwave Assisted Magnetic Recording", IEEE Transactions on Magnetics, vol. 44, No. 1, Jan. 2008, pp. 125-131.

(Continued)

*Primary Examiner* — Brian Miller
(74) *Attorney, Agent, or Firm* — Thomas R. Berthold (57) ABSTRACT

A spin-torque oscillator (STO) has increased magnetic damping of the oscillating free ferromagnetic layer. The Gilbert magnetic damping parameter ($\alpha$) is at least 0.05, and preferably greater than 0.05. The free layer may be a any type of conventional ferromagnetic material, but contains one or more damping elements as a dopant. The damping element is selected from the group consisting of Pt, Pd and the 15 lanthanide elements. The free layer damping may also be increased by a damping layer adjacent the free layer. One type of damping layer may be an antiferromagnetic material, like a Mn alloy. As a modification to the antiferromagnetic damping layer, a bilayer damping layer may be formed of the antiferromagnetic layer and a nonmagnetic metal electrically conductive separation layer between the free layer and the antiferromagnetic layer. Another type of damping layer may be one formed of one or more of the elements selected from Pt, Pd and the lanthanides.

11 Claims, 7 Drawing Sheets

U.S. PATENT DOCUMENTS

| | | | |
|---|---|---|---|
| 2006/0222835 A1 | 10/2006 | Kudo et al. | |
| 2007/0215967 A1 | 9/2007 | Wu et al. | |
| 2007/0242395 A1* | 10/2007 | Bailey | 360/324.2 |
| 2008/0074806 A1 | 3/2008 | Sato et al. | |
| 2008/0088983 A1* | 4/2008 | Meyer et al. | 360/324.1 |
| 2008/0241597 A1 | 10/2008 | Dieny et al. | |
| 2009/0201614 A1 | 8/2009 | Kudo et al. | |
| 2009/0235018 A1 | 9/2009 | Gallagher et al. | |
| 2009/0257154 A1* | 10/2009 | Carey et al. | 360/324.12 |
| 2009/0302403 A1 | 12/2009 | Nguyen | |
| 2010/0033881 A1 | 2/2010 | Carey et al. | |
| 2010/0258889 A1* | 10/2010 | Horng et al. | 257/421 |
| 2010/0328799 A1 | 12/2010 | Braganca et al. | |
| 2011/0007431 A1* | 1/2011 | Braganca et al. | 360/324.12 |
| 2011/0279921 A1* | 11/2011 | Zhang et al. | 360/59 |

OTHER PUBLICATIONS

Bonetti et al., "Spin torque oscillator frequency versus magnetic field angle: The prospect of operation beyond 65 GHz", Applied Physics Letters 94, 102507 (2009).

S. Maat et al., Appl. Phys. Lett 93 (2008) 103506.

N. Smith et al., Phys. Rev. B 81, 184431 (2010).

Tserkovnyak et al., "Enhanced Gilbert Damping in Thin Ferromagnetic Films", Phys Rev Lett, vol. 88, No. 11, Mar. 18, 2002, 117601.

Sankey et al., "Mechanisms limiting the coherence time of spontaneous magnetic oscillations driven by dc spin-polarized currents", Physical Review B 72, 224427 (2005).

* cited by examiner

SPIN-TORQUE OSCILLATOR (STO) WITH MAGNETICALLY DAMPED FREE LAYER

BACKGROUND OF THE INVENTION

1. Field of the Invention

The invention relates generally to a spin-torque oscillator (STO), and more particularly to a magnetic field sensor and sensing system that uses a STO sensor.

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically copper (Cu). One ferromagnetic layer adjacent the spacer layer has its magnetization direction fixed, such as by being pinned by exchange coupling with an adjacent antiferromagnetic layer, and is referred to as the reference layer. The other ferromagnetic layer adjacent the spacer layer has its magnetization direction free to rotate in the presence of an external magnetic field and is referred to as the free layer. With a sense current applied to the sensor, the rotation of the free-layer magnetization relative to the reference-layer magnetization due to the presence of an external magnetic field, such as from the recorded magnetic bits on the disk, is detectable as a change in electrical resistance. If the sense current is directed perpendicularly through the planes of the layers in the sensor stack, the sensor is referred to as a current-perpendicular-to-the-plane (CPP) sensor.

In addition to CPP-GMR read heads, another type of CPP sensor is a magnetic tunnel junction sensor, also called a tunneling MR or TMR sensor, in which the nonmagnetic spacer layer is a very thin nonmagnetic tunnel barrier layer. In a CPP-TMR sensor the tunneling current perpendicularly through the layers depends on the relative orientation of the magnetizations in the two ferromagnetic layers. In a CPP-GMR read head the nonmagnetic spacer layer is formed of an electrically conductive material, typically a metal such as Cu or Ag. In a CPP-TMR read head the nonmagnetic spacer layer is formed of an electrically insulating material, such as $TiO_2$, MgO or $Al_2O_3$.

In CPP MR sensors, it is desirable to operate the sensors at a high bias or sense current density to maximize the signal and signal-to-noise ratio (SNR). However, it is known that CPP MR sensors are susceptible to current-induced noise and instability. The spin-polarized bias current flows perpendicularly through the ferromagnetic layers and produces a spin-torque (ST) effect on the local magnetization. This can produce fluctuations of the magnetization, resulting in substantial low-frequency magnetic noise if the sense current is large.

An alternative sensor based on either a CPP-GMR or CPP-TMR sensor structure, called a spin-torque oscillator (STO) sensor, is designed so that the ST effect generates persistent precession of the magnetization. When a fixed direct current higher than the critical current ($I_c$), is directed through the STO sensor, the magnetization of the free layer precesses or oscillates by virtue of the ST effect. In appropriately designed structures the frequency of this precession (oscillation frequency) shifts with the application of an external magnetic field, and these frequency shifts can be used to detect changes in the external magnetic field. Thus, STO sensors have been proposed for use as read heads in magnetic recording disk drives to replace conventional CPP-GMR and CPP-TMR read heads, as described for example in US 20100328799 A1 assigned to the same assignee as this application, and in US 20090201614 A1. A STO sensor based on a CPP-GMR sensor can operate at higher current densities than a STO sensor based on a CPP-TMR sensor due to its nonmagnetic conductive spacer layer between the reference and free layers. However, a STO sensor based on a CPP-TMR sensor has a significantly higher magnetoresistance ($\Delta R/R$) than a STO sensor based on a CPP-GMR sensor.

A STO sensor with high signal-to-noise ratio (SNR) is desired. Thus a STO sensor should have both high STO output power above background and low oscillator phase noise, which is characterized by narrow spectral line-widths in the frequency response of the oscillator.

SUMMARY OF THE INVENTION

The invention relates to a spin-torque oscillator (STO), such as a STO magnetic field sensor, with increased magnetic damping of the oscillating free layer to thereby increase the critical current. The Gilbert magnetic damping parameter ($\alpha$) from the Landau-Lifshitz-Gilbert-Slonczewski equation should be at least 0.05, and preferably greater than 0.05. In one embodiment the free layer is any type of ferromagnetic material like that used for conventional CPP sensors, but contains one or more damping elements as a dopant or impurity to increase its magnetic damping. The damping element is selected from the group consisting of platinum (Pt), palladium (Pd) and the 15 lanthanide elements. In another embodiment the free layer damping is increased by a damping layer adjacent the free layer opposite the side of the free layer that is adjacent to the nonmagnetic spacer layer. One type of damping layer may be formed of an antiferromagnetic material, like a Mn alloy selected from PtMn, NiMn, FeMn, IrMn, PdMn, PtPdMn and RhMn. As a modification to the antiferromagnetic damping layer, a bilayer damping layer may be formed of the antiferromagnetic layer and a nonmagnetic metal electrically conductive separation layer, such as Cu or Ag, between the free layer and the antiferromagnetic layer. Another type of damping layer may be one formed of one or more of the elements selected from Pt, Pd and the lanthanides.

The STO with increased free layer damping may be the previously-described type based on GMR or TMR with a nonmagnetic spacer layer between the free ferromagnetic layer and the reference ferromagnetic layer. The STO may also be one that does not use a reference layer but has two antiparallel-coupled free ferromagnetic layers separated by a nonmagnetic electrically conductive antiparallel coupling layer, like the STO described in pending application Ser. No. 12/636,108, filed Dec. 11, 2009 and assigned to the same assignee as this application. In this type of STO, one or both of the free layers may be magnetically damped by any of the techniques described above.

For a fuller understanding of the nature and advantages of the present invention, reference should be made to the following detailed description taken together with the accompanying figures.

DETAILED DESCRIPTION OF THE INVENTION

The three-terminal STO according to the invention has applications other than as a magnetic field sensor, but will be described in detail below as magnetic recording disk drive read head.

Figure 1:
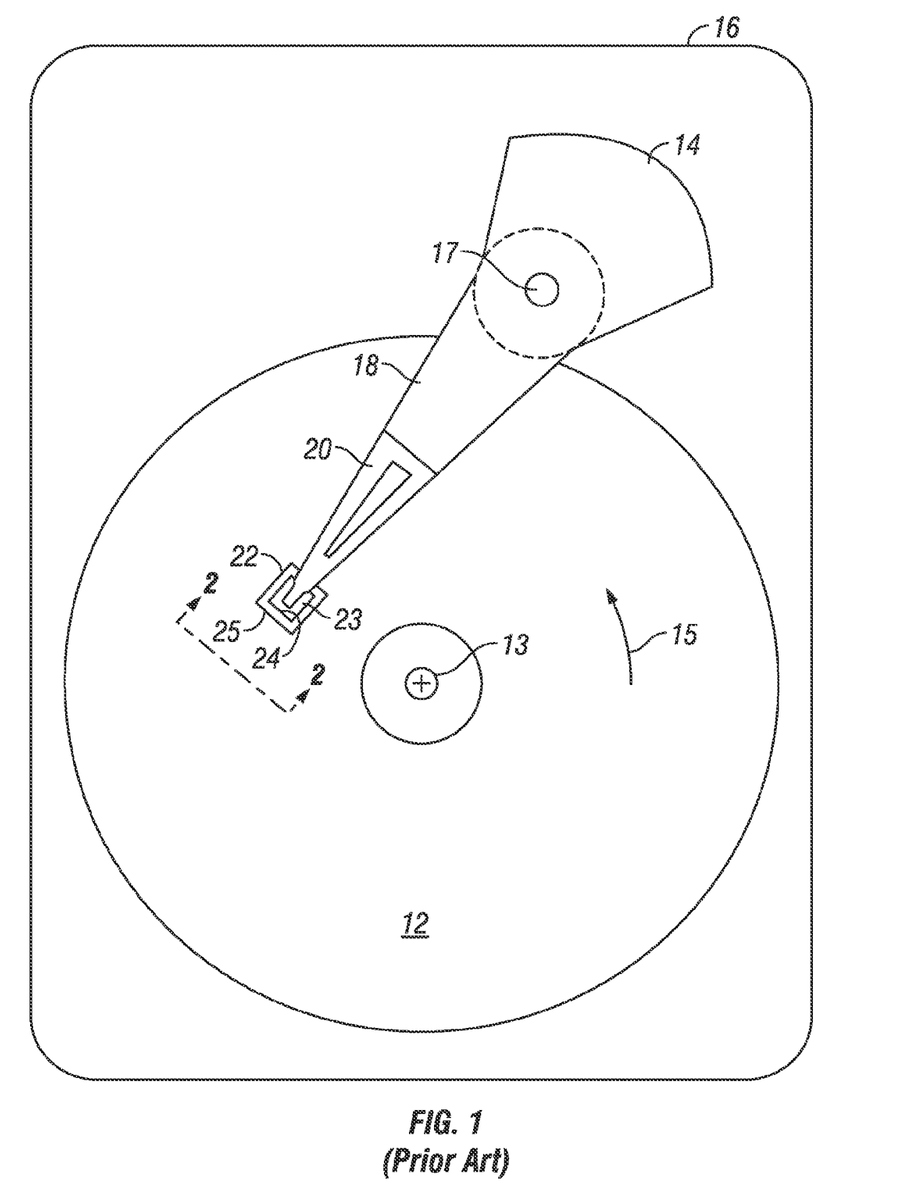
FIG. 1 is a schematic top view of a conventional magnetic recording hard disk drive with the cover removed.

FIGS. 1-4 illustrate a conventional CPP magnetoresistive (MR) magnetic field sensing sensor and system. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
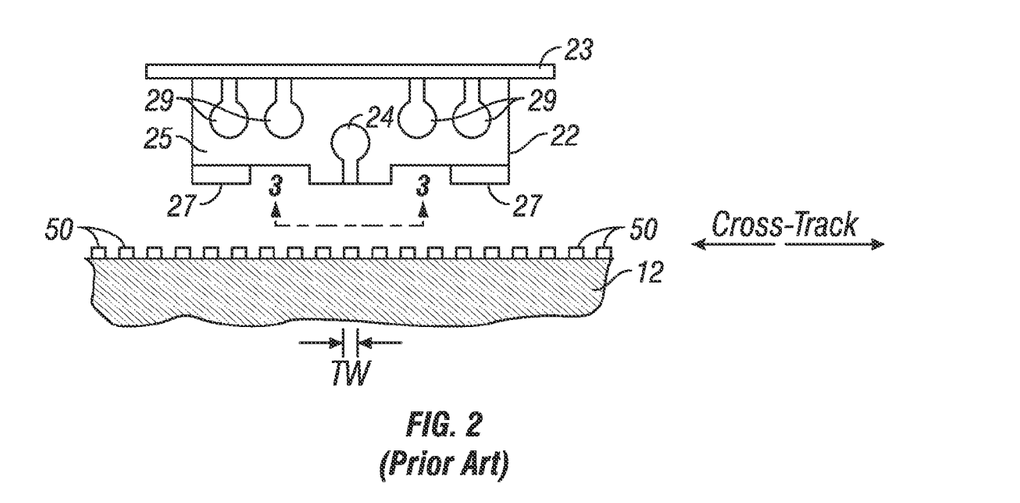
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
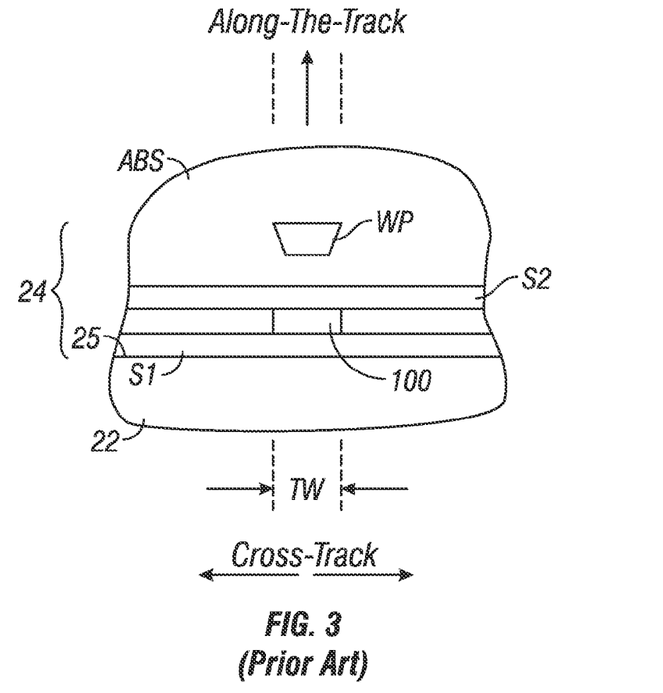
FIG. 3 is a view in the direction 3-3 of FIG. 2 and shows the air-bearing surface (ABS) of the slider with the ends of the read/write head.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP MR sensor or read head 100 is located between two magnetic shields S1 and S2. The shields S1, S2 are formed of magnetically permeable material, typically a NiFe alloy, and may also be electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as tantalum, gold, ruthenium, rhodium or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of about 15 to 40 nm.

Figure 4:
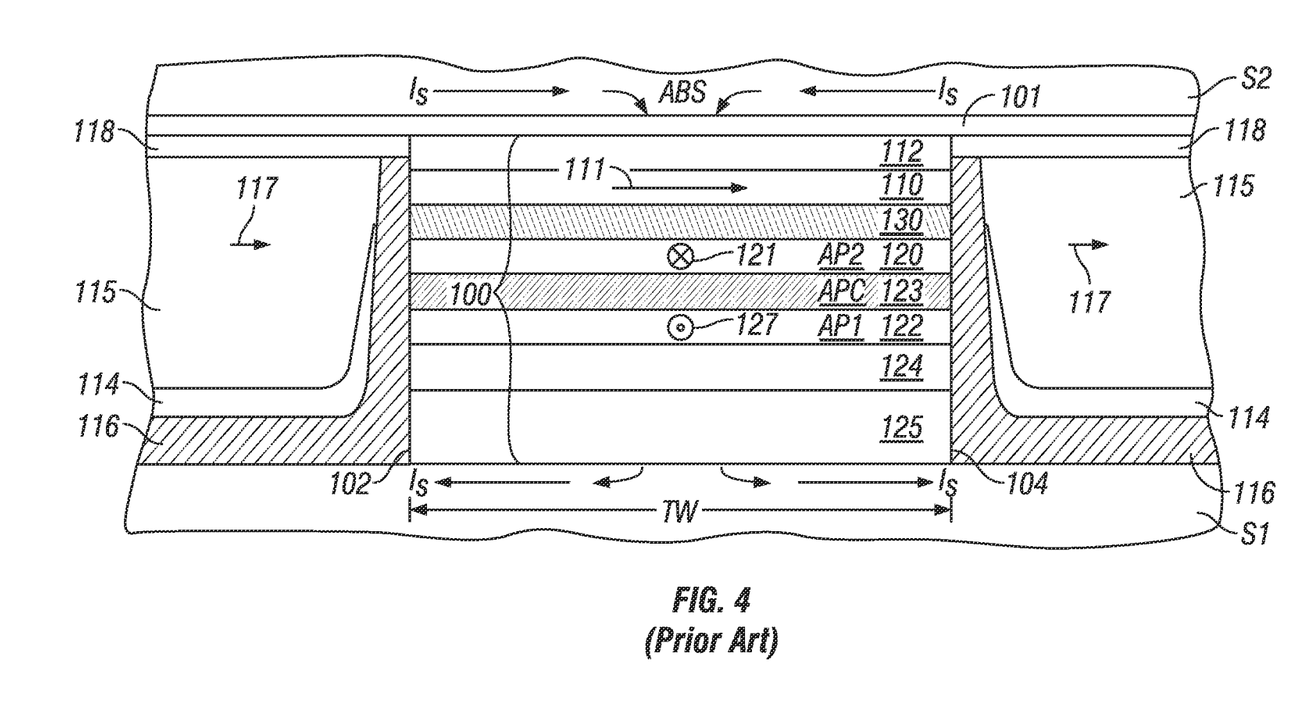
FIG. 4 is a cross-sectional schematic view of the ABS of a current-perpendicular-to-the-plane magnetoresistive (CPP MR) read head showing the stack of layers located between the magnetic shield layers according to the prior art.

FIG. 4 is a view of the ABS showing the layers making up a CPP MR sensor structure as would be viewed from the disk. Sensor 100 is a CPP MR read head comprising a stack of layers formed between the two magnetic shield layers S1, S2. The sensor 100 has a front edge at the ABS and spaced-apart side edges 102, 104 that define the track width (TW). The shields S1, S2 are formed of electrically conductive material and thus may also function as electrical leads for the bias or sense current $I_s$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. A seed layer 101, such as a thin Ru/NiFe bilayer, is deposited, typically by sputtering, below S2 to facilitate the electroplating of the relatively thick S2.

The sensor 100 layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and a nonmagnetic spacer layer 130 between the reference layer 120 and free layer 110. The CPP MR sensor 100 may be a CPP GMR sensor, in which case the nonmagnetic spacer layer 130 would be formed of an electrically conducting material, typically a metal like Cu, Au or Ag. Alternatively, the CPP MR sensor 100 may be a CPP tunneling MR (CPP-TMR) sensor, in which case the nonmagnetic spacer layer 130 would be a tunnel barrier formed of an electrically insulating material, like $TiO_2$, MgO or $Al_2O_3$.

The pinned ferromagnetic layer in a CPP MR sensor may be a single pinned layer or an antiparallel (AP) pinned structure like that shown in FIG. 4. An AP-pinned structure has first (AP1) 122 and second (AP2) 120 ferromagnetic layers separated by a nonmagnetic antiparallel coupling (APC) layer 123 with the magnetization directions of the two AP-pinned ferromagnetic layers oriented substantially antiparallel. The AP2 layer 120, which is in contact with the nonmagnetic APC layer 120 on one side and the sensor's electrically nonmagnetic spacer layer 130 on the other side, is typically referred to as the reference layer. The AP1 layer 122, which is typically in contact with an antiferromagnetic layer 124 or hard magnet pinning layer on one side and the nonmagnetic APC layer 123 on the other side, is typically referred to as the pinned layer. The AP-pinned structure minimizes the net magnetostatic coupling between the reference/pinned layers and the CPP MR free ferromagnetic layer. The AP-pinned structure is sometimes also called a "laminated" pinned layer or a synthetic antiferromagnet (SAF).

The pinned layer in the CPP GMR sensor in FIG. 4 is a well-known AP-pinned structure with reference ferromagnetic layer 120 (AP2) and a lower ferromagnetic layer 122 (AP1) that are antiferromagnetically coupled across an AP coupling (APC) layer 123. The APC layer 123 is typically Ru, Ir, Rh, Cr or alloys thereof. The AP1 and AP2 layers, as well as the free ferromagnetic layer 110, are typically formed of a ferromagnetic alloy of one or more of Co, Fe and Ni, such as crystalline CoFe or NiFe alloys, or a multilayer of these materials, such as a CoFe/NiFe bilayer. The AP1 and AP2 ferromagnetic layers have their respective magnetization directions 127, 121 oriented antiparallel. The AP1 layer 122 may have its magnetization direction pinned by being exchange-coupled to an antiferromagnetic (AF) layer 124 as shown in FIG. 4. The AF layer 124 is typically a Mn alloy, e.g., PtMn, NiMn, FeMn, IrMn, PdMn, PtPdMn or RhMn. Alternatively, the AP-pinned structure may be "self-pinned". In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar moments. This assures that the net magnetic moment of the AP-pinned structure is small so that magnetostatic coupling to the free layer 110 is minimized and the effective pinning field of the AF layer 124, which is approximately inversely proportional to the net magnetic moment of the AP-pinned structure, remains high.

A seed layer 125 may be located between the lower shield layer S1 and the AP-pinned structure. If AF layer 124 is used, the seed layer 125 enhances the growth of the AF layer 124. The seed layer 125 is typically one or more layers of NiFeCr, NiFe, Ta, Cu or Ru. A capping layer 112 is located between the free ferromagnetic layer 110 and the upper shield layer S2. The capping layer 112 provides corrosion protection and may be a single layer or multiple layers of different materials, such as Ru, Ta, Ti, or a Ru/Ta/Ru, Ru/Ti/Ru, or Cu/Ru/Ta trilayer.

A ferromagnetic biasing layer 115, such as a CoPt or CoCrPt hard magnetic bias layer, is also typically formed outside of the sensor stack near the side edges 102, 104 of the sensor 100. The biasing layer 115 is electrically insulated from side edges 102, 104 of sensor 100 by insulating layer 116. An optional seed layer 114, such as a Cr alloy like CrMo or CrTi, may be deposited on the insulating layer 116 to facilitate the growth of the biasing layer 115, particularly if the biasing layer is a CoPt or CoPtCr layer. A capping layer 118, such as layer of Cr, or a multilayer of Ta/Cr is deposited on top of the biasing layer 115. The upper layer of capping layer 118, for example Cr, also serves the purpose as a chemical-mechanical-polishing (CMP) stop layer during fabrication of the sensor. The biasing layer 115 has a magnetization 117 generally parallel to the ABS and thus longitudinally biases the magnetization 111 of the free layer 110. Thus in the absence of an external magnetic field its magnetization 117 is parallel to the magnetization 111 of the free layer 110. The ferromagnetic biasing layer 115 may be a hard magnetic bias layer or a ferromagnetic layer that is exchange-coupled to an antiferromagnetic layer. A seed layer 101, such as a NiFe layer, for the shield layer S2 may be located over the sensor 100 and capping layer 118.

In the presence of an external magnetic field in the range of interest, i.e., magnetic fields from recorded data on the disk, the magnetization direction 111 of free layer 110 will rotate while the magnetization direction 121 of reference layer 120 will remain fixed and not rotate. Thus when a sense current $I_s$ is applied from top shield S2 perpendicularly through the sensor stack to bottom shield S1 (or from S1 to S2), the magnetic fields from the recorded data on the disk will cause rotation of the free-layer magnetization 111 relative to the reference-layer magnetization 121, which is detectable as a change in electrical resistance.

However, if the sense current $I_s$ is greater than some critical current ($I_c$) the spin-torque (ST) effect can produce gyrations or fluctuations of the free layer magnetization, resulting in substantial low-frequency magnetic noise that reduces the sensor's signal-to-noise ratio (SNR) to an undesirable level.

An alternative sensor based on a CPP-GMR or CPP-TMR sensor, called a spin torque oscillator (STO) sensor, operates with current greater than $I_c$ to deliberately induce the ST effect and thus takes advantage of the ST-induced forces acting on the free layer. When a current higher than $I_c$ is directed through this type of STO sensor, the magnetization of the free layer precesses or oscillates by virtue of the ST effect. The frequency of this precession (oscillation frequency) shifts with the application of an external magnetic field, and these frequency shifts can be used to detect changes in the external magnetic field. Thus, STO sensors have been proposed for use as read heads in magnetic recording disk drives to replace conventional CPP-GMR and CPP-TMR read heads, as described for example in US 20100328799 A1 assigned to the same assignee as this application, and in US 20090201614 A1.

High SNR signal demodulation requires both high STO output power above background and low oscillator phase noise, which is characterized by narrow spectral line-widths in the frequency response of the oscillator. In the present invention the intrinsic magnetic damping of the oscillating free layer is increased. The well-known Landau-Lifshitz-Gilbert-Slonczewski equation describes the precessional motion of the magnetization M in a solid with an effective magnetic field $H_{eff}$ and with damping that is excited using electric current I:

$$\frac{d\hat{M}}{dt} = \gamma \hat{M} \times H_{eff} - \gamma \alpha \hat{M} \times (\hat{M} \times H_{eff}) - \frac{I\gamma h g(\theta)}{2eM_s V} \hat{M} \times (\hat{M}_{fixed} \times \hat{M})$$

The parameter $\alpha$ is the Gilbert damping constant or parameter and is a dimensionless coefficient and depends on the solid, $\gamma$ is the electron gyromagnetic ratio, e is electron charge, $\hbar$ is the reduced Planck's constant, $M_s$ and V are the saturation magnetization and the volume of the oscillating magnet respectively, $M_{fixed}$ is the magnetization direction of the reference layer and $g(\theta)$ is a function describing the dependence of spin torque on the angle between free and reference layer moments.

In this invention increasing the magnetic damping of the oscillating free layer increases the critical current $I_c$ required to excite oscillations in the STO, therefore improving output signal strength, which is critical for applications in both magnetic field detection and high frequency RF electronics. More importantly, simulations have shown that for ST-generated large precession angle oscillations, contrary to conventional ferromagnetic resonance, increased damping can lower phase noise induced by thermally driven fluctuations of the precessional angle of the oscillator, which is the dominant mechanism for line-width broadening of the oscillator's spectral response. To achieve these results the STO according to this invention has a free layer with a relatively high Gilbert damping parameter, preferably greater than 0.05.

Figure 5:
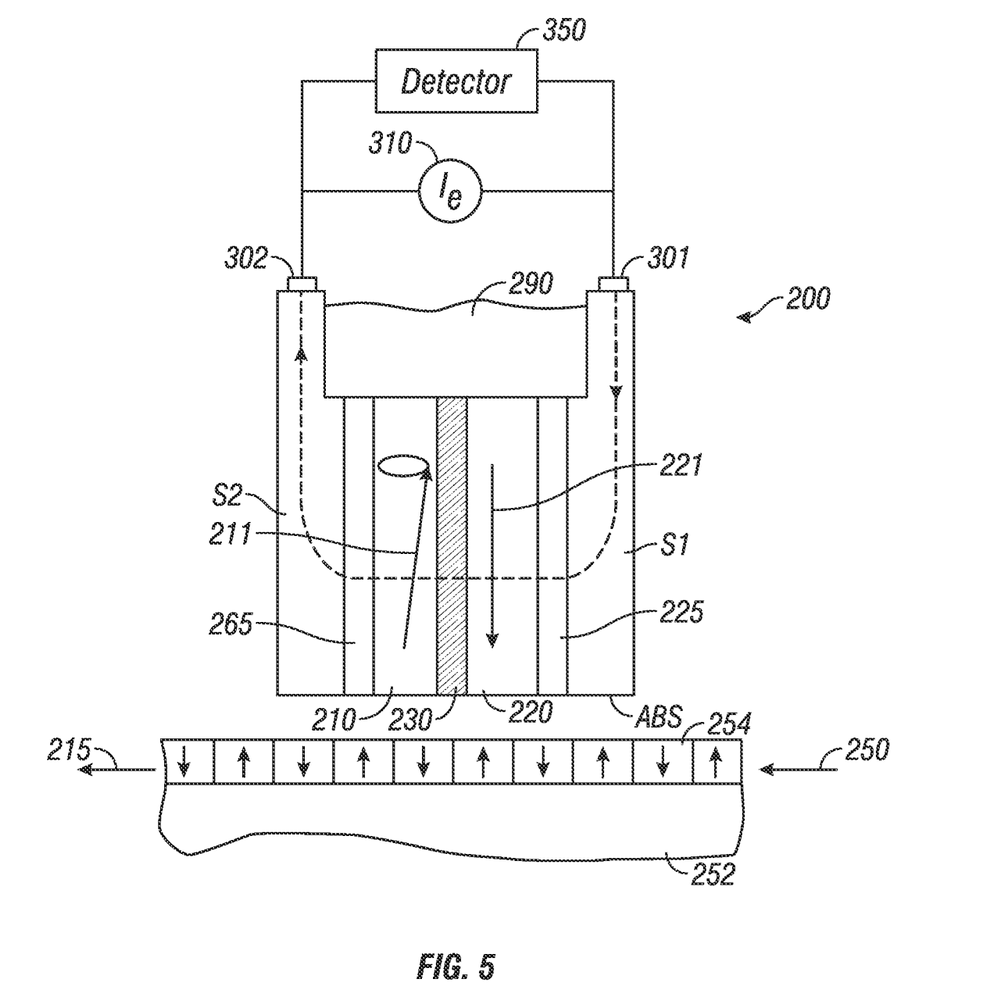
FIG. 5 is a schematic of a magnetic field spin-torque oscillator (STO) sensing system according to a first embodiment of the invention with a doped free ferromagnetic layer.

FIG. 5 is a schematic of a magnetic field sensing system using a STO sensor 200 according to a first embodiment of the invention. The system is illustrated as a magnetic recording disk drive with STO sensor 200 with its ABS facing the disk 250. The sensor 200 includes a stack of individual layers of a CPP-GMR or CPP-TMR sensor as previously-described with respect to CPP sensor 100. The disk 250 has a substrate 252 and a recording layer 254 that serves as the magnetic recording medium with magnetized regions depicted by the arrows directed toward or away from the ABS. As the disk rotates, the magnetized regions move in the direction of arrow 215 past the sensor 200. The recording layer 254 is depicted as a perpendicular magnetic recording medium with the regions magnetized perpendicularly to the plane of recording layer 254, but alternatively it may be a longitudinal magnetic recording medium with the regions being magnetized in the plane of recording layer 254. The STO sensor 200 has a first shield layer S1 that may serve as a substrate for the deposition of the set of layers, a second shield layer S2, and a single free ferromagnetic layer 210 that has a substantially in-plane magnetization 211 free to oscillate in the presence of an external magnetic field to be sensed. The free layer 210 forms part of a GMR structure with nonmagnetic electrically conductive spacer layer 230 and reference layer 220 having a fixed in-plane magnetization 221. The reference layer 220 may be a single pinned layer or the AP2 layer of an AP-pinned structure. A non-ferromagnetic conducting metal "break" layer 225 is located between S1 and first reference layer 220 for breaking any magnetic exchange interaction between S1 and reference layer 220 or other ferromagnetic layers in the sensor stack while permitting electrical conduction. Similarly, a non-ferromagnetic conducting metal "break" layer 265 is located between S2 and free layer 210. Typical materials for layers 225, 265 are Cu, Ag, Ta and Ru. The order of the sensor layers in the stack could be reversed from what is shown in FIG. 5, with free layer 210 being deposited first on layer 265 on S1, followed by conductive spacer layer 230, reference layer 220, and layer 225, with S2 being located on layer 225. Also, the STO sensor 200 may be one based on a TMR sensor, rather than a GMR sensor, in which case nonmagnetic conductive spacer layer 230 would be replaced by an insulating tunnel barrier layer.

The STO sensor 200 has electrical contacts or terminals 301, 302 for connection to electrical circuitry, including excitation current $I_e$ source 310. The terminals 301, 302 are depicted for ease of illustration in FIG. 5 as being directly connected to their respective layers, but would likely be located on the trailing surface of the slider, as depicted in FIG. 2 by terminal pads 29 on trailing surface 25 of slider 22. The sensor includes insulating material 290 in the back region recessed from the ABS for electrically isolating the layers from one another.

The electrical circuitry connected to STO sensor 200 includes a constant current source 310 that supplies a direct current (DC) excitation current $I_e$ between terminals 301, 302 through the stack of layers and a detector 350. The excitation current is greater than the critical current $I_c$ for the GMR structure and is high enough to provide sufficient current density to cause the magnetization 211 of the free layer 210 to oscillate at a fixed base frequency in the absence of an external magnetic field. A detector 350 is coupled to the circuitry and detects shifts in the free layer magnetization 211 oscillation frequency from the base frequency in response to the external magnetic fields from the magnetized regions of recording layer 254. The current source 310 may instead apply an alternating current (AC) excitation current or an AC excitation current with a DC bias. This can allow for frequency locking of the oscillator to a fixed driving frequency, with associated pulling and detection of the magnetic field by phase detection, as is known in the literature, for example "Injection Locking and Pulling in Oscillators", B Razavi, et al., *IEEE J of Solid State Circuits* 39, 1415 (2004), and patent U.S. Pat. No. 7,633,699).

In the first embodiment of the invention the free layer 210 is any type of ferromagnetic material like that used for conventional CPP sensors, but contains one or more damping elements as a dopant or impurity to increase its magnetic damping. The damping element or elements is selected from the group consisting of the 15 lanthanide elements and platinum (Pt) and palladium (Pd). The lanthanides are lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Pt and Pd are heavy elements with strong spin-orbit coupling, as described by Tserkovnyak et al., "Enhanced Gilbert Damping in Thin Ferromagnetic Films", *Phys Rev Lett*, Vol. 88, No. 11, 18 Mar. 2002, 117601. The amount of the impurity is preferably in the range of about 1 to 5 atomic percent of the free layer composition. For example, the free layer 210 may have the composition $(Co_{50}Fe_{50})_{100-y}X_y$, where y is between about 1 and 5, and X represents one or more of the selected elements. The magnetic damping parameter should be at least 0.05, and preferably greater than 0.05. For example, a CoFe ferromagnetic material may have an intrinsic magnetic damping parameter between 0.01 and 0.03, but with the addition of Dy in an amount of between about 1 to 5 atomic percent, the magnetic damping parameter will be increased to somewhere between 0.05 and 0.15.

Figure 6:
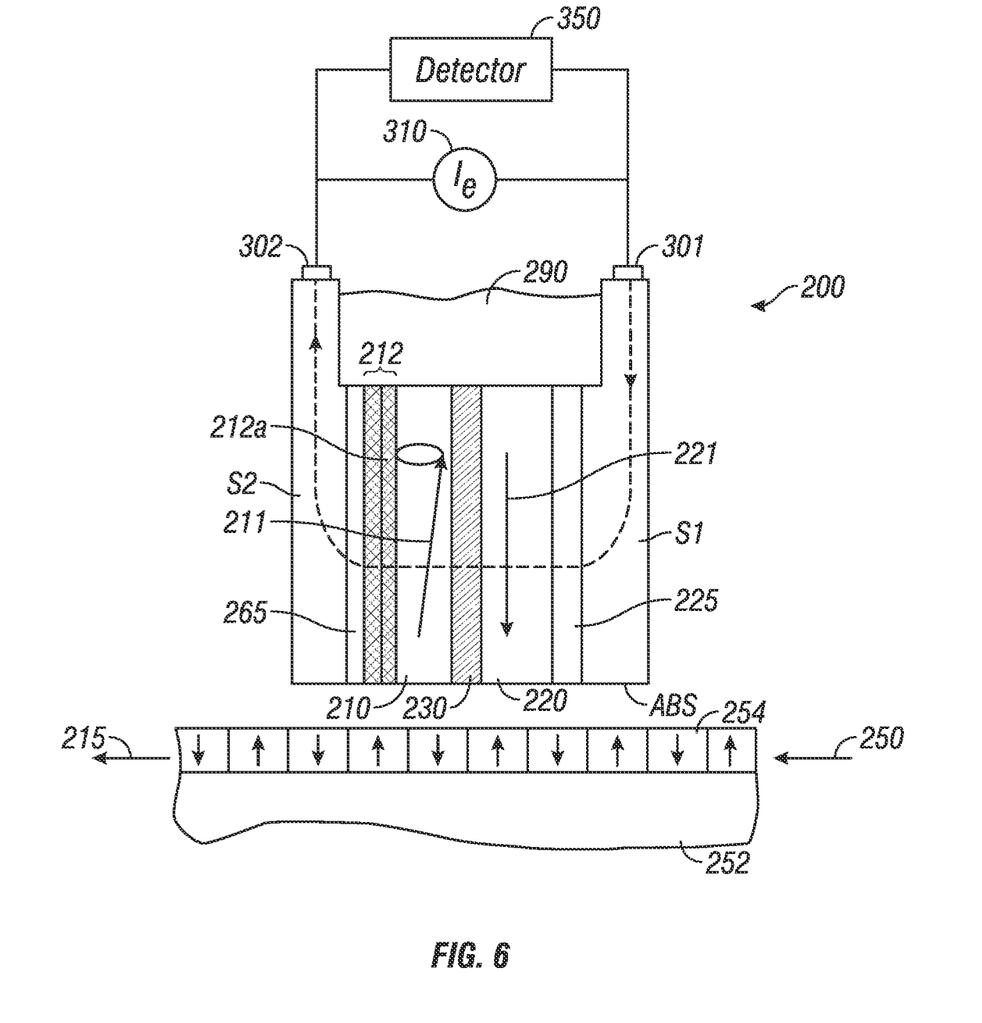
FIG. 6 is a schematic of a magnetic field STO sensing system according to a second embodiment of the invention with a damping layer adjacent the free ferromagnetic layer.

FIG. 6 is a schematic of a magnetic field sensing system using a STO sensor 200 according to a second embodiment of the invention. The embodiment of FIG. 6 is like that of FIG. 5 except that the free layer 210 is not doped, but is magnetically damped by a damping layer 212. Damping layer 212 is in contact with the side of free layer 210 opposite the side of free layer 210 that is adjacent to spacer layer 230. Damping layer 212 in FIG. 6 may be a single layer formed of an antiferromagnetic material, like a Mn alloy such as PtMn, NiMn, FeMn, IrMn, IrMnCr, PdMn, PtPdMn and RhMn alloys in direct contact with free layer 210. For example, if free layer 210 is a CoFe ferromagnetic material with an intrinsic magnetic damping parameter of about 0.015, the addition of a 6 to 8 nm thick antiferromagnetic damping layer 212 formed of IrMn will increase the magnetic damping parameter to ~0.1 [See N. Smith et al., *Phys. Rev. B* 81, 184431 (2010)]. Alternatively, the damping layer 212 may be a bilayer damping layer formed of the antiferromagnetic layer and a nonmagnetic metal electrically conductive separation layer 212a, such as Cu or Ag, between the free layer 210 and the antiferromagnetic layer. The separation layer 212a may have a thickness between about 0.1 to 3 nm.

US 20080241597 A1 describes a STO with means for damping the free layer like that described above for FIGS. 5 and 6. However, this reference is directed to relatively moderate damping of the free layer (a Gilbert damping parameter from 0.01 to 0.05) to avoid excessive values of current density ($\sim 10^7$ A/cm$^2$ or greater). In contrast, in the present invention it is preferable to go beyond this range of damping for at least two reasons. First, the signal power of the STO is approximately proportional to the square of the excitation current, so there is a significant advantage to increasing damping so that a much higher current density ($>10^7$ A/cm$^2$) can be used for exciting oscillations. Secondly, it has been discovered that by increasing damping beyond a Gilbert parameter of 0.05, there are less perturbations to the precession orbit of the free layer moment. This results in less phase noise and improvement in the spectral purity of the STO, i.e., if the signal is measured in the frequency space a spike with a narrower line-width is obtained.

For the second embodiment of the invention, shown in FIG. 6, an alternative to an antiferromagnetic damping layer is a damping layer 212 formed of one or more of the elements selected from Pt, Pd and the lanthanides without the separation layer 212a. For example, if free layer 210 is a CoFe ferromagnetic material with an intrinsic magnetic damping parameter of 0.015, the addition of a 1 nm thick damping layer 212 formed of Dy will increase the magnetic damping parameter to about 0.05 [See S. Maat et al., *Appl. Phys. Lett* 93 (2008) 103506].

Figure 7:
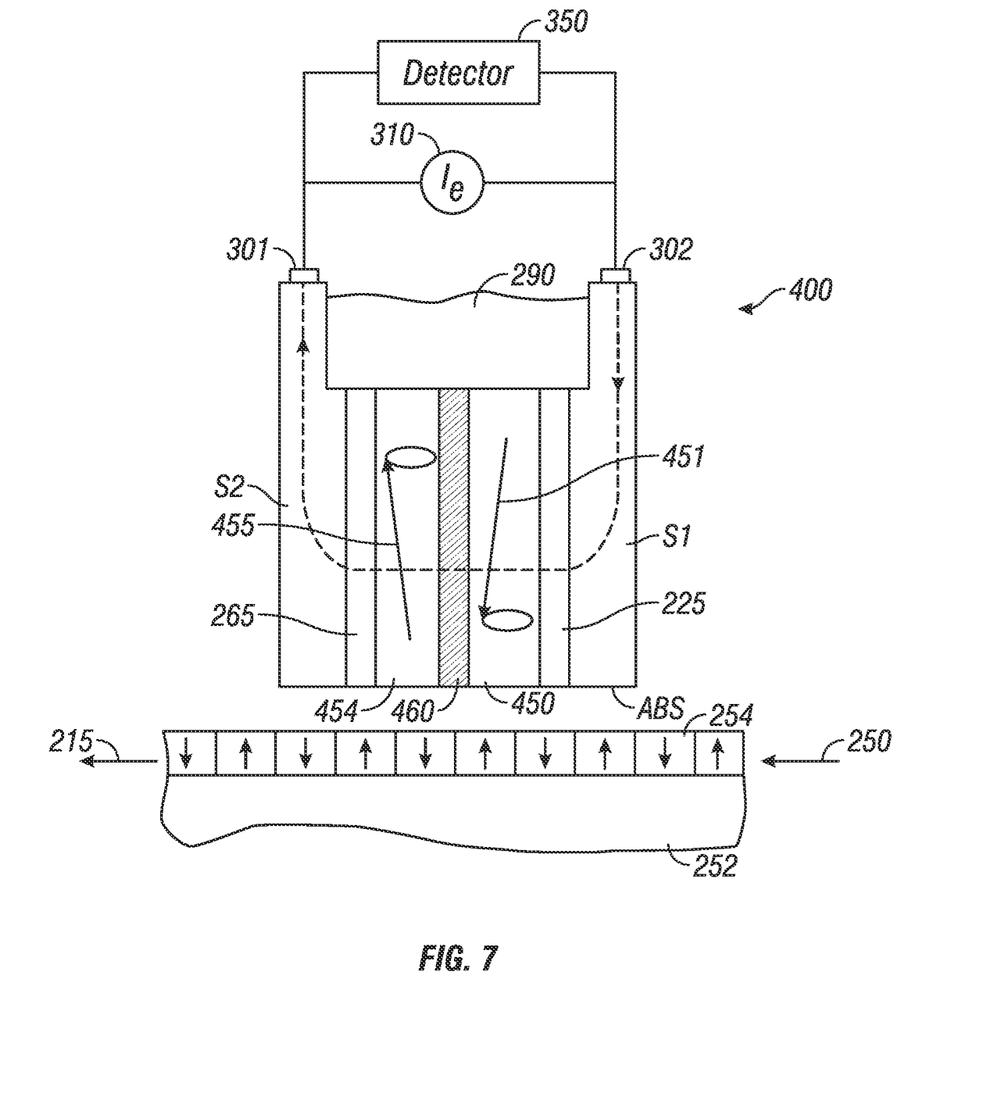
FIG. 7 is a schematic of a magnetic field STO sensing system using a STO sensor with two antiparallel-coupled free ferromagnetic layers without a reference layer.

FIG. 7 is a schematic of a magnetic field sensing system using a STO sensor 400 different than STO sensor 200 (FIGS. 5 and 6), but with the means for damping the free layer as described above with respect to the STO sensor 200. The STO sensor does not use a reference layer but has two antiparallel-coupled free ferromagnetic layers 450, 454 separated by a nonmagnetic electrically conductive antiparallel coupling (APC) layer 460. A STO sensor like that shown in FIG. 7 is described in application Ser. No. 12/636,108, filed Dec. 11, 2009 and assigned to the same assignee as this application. Free ferromagnetic layers 450, 454 have substantially in-plane magnetizations 451, 455, respectively, but the magnetizations 451, 455 are oriented substantially antiparallel in the absence of an excitation current. The magnetizations 451, 455 are free to oscillate in the presence of an external magnetic field to be sensed. APC layer 460 is thin, typically between about 0.2 and 3 nm, to strongly antiparallel couple the two free layers 450, 454. APC layer 460 may be formed of a material such as Ru, Cu, Ir or other suitable nonmagnetic conductive material that can provide antiparallel coupling and should have sufficiently low spin scattering (as may arise from spin orbit scattering) that the polarization of. Free layers 450, 454 may be formed of a magnetic material such as CoFe, Co, NiFe or a combination of these materials, or any other suitable free layer material used for GMR and TMR magnetoresistive sensors known in the art. To achieve magnetic oscillations in this antiferromagnetically coupled system, it is desirable that one of the free layers has a greater magnetic moment than the other free layer. Magnetic moment can be defined as the product of the physical thickness of a magnetic layer multiplied by the saturation magnetization of the material making up the layer. By way of example, the free layers 450, 454 can be formed of the same or similar magnetic materials, with one layer 450 having a physical thickness of about 4 nm and the other layer 454 having a physical thickness of about 2 nm.

The excitation current from current source 310 through the stack of layers causes the magnetizations 451, 454 to oscillate as a result of the ST effect. The ST-induced oscillations move in a precessional or conical manner at a frequency that varies in response to a magnetic field as previously described, and are detected by detector 350. While the magnetizations 451, 455 are antiparallel coupled, they oscillate in a fashion such that the moments of both layers projected onto a plane that is parallel with APC layer 460 maintain a scissor like motion with respect to one another. Therefore, during this oscillation, the magnetizations 451, 455 move in and out of being antiparallel with one another. This causes a change in resistance across the sensor stack that has a frequency that responds to a external magnetic field. The scissor-like motion in which the magnetizations of both free layers move is different than that of the previously described STO sensor like that of FIG. 5 in which the free layer magnetization motion is large and the pinned layer magnetization is essentially motionless.

In the present invention the STO sensor of FIG. 7 includes means for increasing the magnetic damping of one or both free layers 450, 454 using any one of the techniques described above with respect to the embodiments of FIGS. 5 and 6. Thus one or both of free layers 450, 454 may be doped with one or more elements selected from Pt, Pd and the lanthanides. One or both of free layers 450, 454 may be magnetically damped by an antiferromagnetic damping layer, or bilayer of an antiferromagnetic layer and separation layer, with the antiferromagnetic damping layer or bilayer located on the side of the free layer opposite the side that is adjacent to APC layer 460. One or both of free layers 450, 454 may be magnetically damped by a damping layer formed of one or more of the elements selected from Pt, Pd and the lanthanides, with the damping layer being located on the side of the free layer opposite the side that is adjacent to APC layer 460.

In the magnetically damped STO sensor of FIG. 7, like that of FIG. 5, it is preferable that the Gilbert damping parameter of at least one of the free layers be greater than 0.05 to assure that a high current density ($>10^7$ A/cm$^2$) can be used for exciting oscillations of the two free layers. However, it is possible that the Gilbert damping parameter of both free layers be less than 0.05 in the STO sensor of FIG. 7 and still result in a high current sufficient to provide a high signal output power.

Figure 8:
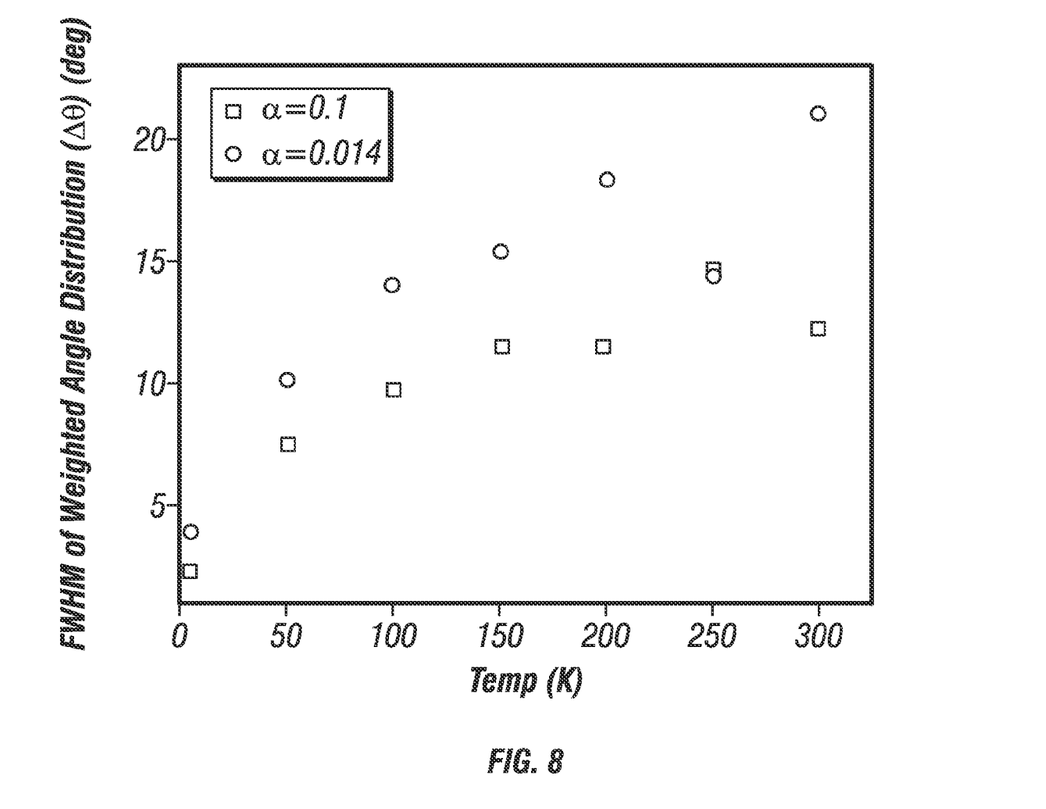
FIG. 8 is a graph of the modeled full-width half-maximum (FWHM) distribution of the free layer's precession angle as a function of temperature for two values of Gilbert damping parameter calculated using a macrospin simulation.

As previously mentioned, the invention is based partly on the discovery that increased damping can lower phase noise induced by thermally driven fluctuations of the precessional angle of the oscillator, which is the dominant mechanism for line-width broadening of the oscillator's spectral response. There are two sources of phase noise contributing to line-width broadening, both of which arise from thermal fluctuations. These are fluctuations along and perpendicular to the motion of the spin, i.e., "velocity noise" and "angle noise". The value of velocity noise has been calculated to be relatively low, so angle noise is expected to dominate phase noise. The full-width half-maximum (FWHM) distribution of the free layer's precession angle θ caused by thermal fluctuations is Δθ. The effects of temperature and damping on Δθ have been calculated from simulation modeling and are shown in FIG. 8. The results of FIG. 8 show that increased free layer damping can have an effect in reducing thermally driven fluctuations in the precession angle, thereby decreasing the phase noise of the oscillator.

As previously mentioned, while the STO according to the invention has been described in detail with application as a magnetic field sensor, in particular a magnetic recording disk drive read head, the invention has other applications. Other applications of the STO, all of which would benefit from a high signal output to detect the frequency or phase of the free layer oscillation include mixers, radio, cell phones and radar (including vehicle radar). See for example, "STO frequency vs. magnetic field angle: The prospect of operation beyond 65 GHz", by Bonetti et al, *APL* 94 102507 (2009).

Still another application is for high-frequency assisted writing in magnetic recording, such as a magnetic recording disk drive. In this technique, also called microwave-assisted magnetic recording (MAMR), the STO applies a high-frequency oscillatory magnetic field to the magnetic grains of the recording layer as a magnetic field auxiliary to the magnetic write field from the conventional write head. The auxiliary field may have a frequency close to the resonance frequency of the magnetic grains in the recording layer to facilitate the switching of the magnetization of the grains at lower write fields from the conventional write head than would otherwise be possible without assisted recording. In one type of MAMR system, a STO based on either GMR or TMR operates with the magnetization of the reference layer and the magnetization of the free layer, in the absence of an excitation current, oriented perpendicular to the planes of the layers. See for example "Microwave Assisted Magnetic Recording", by J. G. Zhu et al., *IEEE Transactions on Magnetics*, Vol. 44, No. 1, January 2008, pp. 125-131. Thus when the STO according to the invention, like that shown in FIG. 5, is used as a STO for MAMR, the magnetization of reference layer 220 would be oriented perpendicular to the plane of the layer, and the magnetization 211 of the free layer 210, in the absence of excitation current $I_e$, would also be oriented perpendicular to the plane of the layer.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A spin-torque oscillator (STO) comprising:
   a substrate; and
   a set of layers on the substrate comprising:
      a damped free ferromagnetic layer having a damping parameter greater than 0.05 and a magnetization that oscillates in the presence of an excitation current perpendicularly through the plane of the free layer;
      a ferromagnetic reference layer having a fixed magnetization; and
      a nonmagnetic spacer layer between and in contact with said damped free layer and the reference layer; and
   electrical circuitry connected to the set of layers for supplying an excitation current through the spacer layer, the excitation current being selected from a direct current (DC) and an alternating current (AC) and having a current density greater than $10^7$ A/cm$^2$.

2. The STO of claim 1 wherein the damped free ferromagnetic layer comprises a ferromagnetic alloy and a dopant element selected from the group consisting of Pt, Pd, La, Ce, Pr, Nd, Pm, Sm, Eu, Gd, Tb, Dy, Ho, Er, Th, Yb, and Lu.

3. The STO of claim 1 wherein the damped free ferromagnetic layer comprises a ferromagnetic alloy layer and an antiferromagnetic layer, the ferromagnetic alloy layer being located between the spacer layer and the antiferromagnetic layer and the antiferromagnetic layer comprising a Mn alloy.

4. The STO of claim 3 further comprising a metallic electrically conductive separation layer between said ferromagnetic alloy layer and said antiferromagnetic layer.

5. The STO of claim 1 wherein the damped free ferromagnetic layer comprises a ferromagnetic alloy layer and a damping layer in contact with the ferromagnetic alloy layer and consisting essentially of at least one element selected from the group consisting of Pt, Pd, La, Ce, Pr, Nd, Pm, Sm, Eu, Gd, Tb, Dy, Ho, Er, Th, Yb, and Lu, the ferromagnetic alloy layer being located between the spacer layer and the damping layer.

6. The STO of claim 1 wherein the magnetization of the reference layer is oriented substantially perpendicular to the plane of the layer.

7. The STO of claim 1 wherein the magnetization of the reference layer is oriented substantially in the plane of the layer.

8. The STO of claim 1 wherein the magnetization direction of said damped free layer, in the absence of an excitation current, is substantially antiparallel to the magnetization direction of the reference layer.

9. The STO of claim 1 wherein the spacer layer is an electrically conductive spacer layer.

10. The STO of claim 1 wherein the spacer layer is an insulating tunnel barrier layer.

11. A spin-torque oscillator (STO) comprising:
   a substrate;
   a set of layers on the substrate comprising:
      a free ferromagnetic layer having a magnetization that oscillates in the presence of an excitation current perpendicularly through the plane of said free layer;
      a ferromagnetic reference layer having a fixed magnetization;
      a nonmagnetic spacer layer between and in contact with said free layer and the reference layer; and
      a damping layer for increasing the magnetic damping of said free layer, the damping layer being in contact with said free layer on side of said free layer opposite the side in contact with the spacer layer, wherein said free layer has a damping parameter greater than 0.05;
   wherein the damping layer is selected from one of (a) a layer consisting essentially of at least one element selected from the group consisting of Pt, Pd, La, Ce, Pr, Nd, Pm, Sm, Eu, Gd, Tb, Dy, Ho, Er, Th, Yb, and Lu; and (b) a bilayer of a metallic electrically conductive layer in contact with said free layer and an antiferromagnetic layer in contact with the metallic conductive layer, the antiferromagnetic layer comprising a Mn alloy; and
   electrical circuitry connected to the set of layers for supplying an excitation current through the spacer layer, the excitation current being selected from a direct current (DC) and an alternating current (AC) and having a current density greater than $10^7$ A/cm$^2$.

* * * * *